United States Patent
Wu et al.

(10) Patent No.: US 9,538,628 B1
(45) Date of Patent: Jan. 3, 2017

(54) METHOD FOR EUV POWER IMPROVEMENT WITH FUEL DROPLET TRAJECTORY STABILIZATION

(71) Applicant: Taiwan Semiconductor Manufacturing Co., Ltd., Hsin-Chu (TW)

(72) Inventors: Tsiao-Chen Wu, Jhudong Township (TW); Jaw-Jung Shin, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/736,322

(22) Filed: Jun. 11, 2015

(51) Int. Cl.
*H05G 2/00* (2006.01)
*G03F 7/20* (2006.01)

(52) U.S. Cl.
CPC .......... *H05G 2/005* (2013.01); *G03F 7/70033* (2013.01); *H05G 2/008* (2013.01)

(58) Field of Classification Search
CPC .......... H05G 2/00; H05G 2/001; H05G 2/003; H05G 2/005; H05G 2/006; H05G 2/008; G21K 5/00; G21K 5/02; G03F 7/00025; G03F 7/00033; G03F 7/70033
See application file for complete search history.

(56) References Cited

U.S. PATENT DOCUMENTS

| | | | |
|---|---|---|---|
| 5,569,916 | A | 10/1996 | Tomie |
| 6,973,164 | B2 | 12/2005 | Hartlove et al. |
| 2005/0205810 | A1* | 9/2005 | Akins .................... B82Y 10/00 250/504 R |
| 2006/0255298 | A1 | 11/2006 | Bykanov et al. |
| 2009/0272919 | A1* | 11/2009 | Abe .................... G03F 7/70033 250/504 R |

(Continued)

FOREIGN PATENT DOCUMENTS

| | | |
|---|---|---|
| EP | 1492394 B1 | 1/2013 |
| WO | 2006091948 A2 | 8/2006 |

OTHER PUBLICATIONS

Gigaphoton. "EUV Source Update." 3rd ASML NXE3300B Customer Program Meeting. Jun. 9, 2011.

(Continued)

*Primary Examiner* — David E Smith
(74) *Attorney, Agent, or Firm* — Eschweiler & Associates, LLC (57) ABSTRACT

The present disclosure relates to an extreme ultraviolet (EUV) radiation source that generates charged tin droplets having a trajectory controlled by an electromagnetic field, and an associated method. In some embodiments, the EUV radiation source has a laser that generates a laser beam. A charged fuel droplet generator provides a plurality of charged fuel droplets having a net electrical charge to an EUV source vessel. An electromagnetic field generator generates an electric field and/or a magnetic field. The net electrical charge of the charged fuel droplets causes the electric or magnetic field to generate a force on the charged fuel droplets that controls a trajectory of the charged fuel droplets to intersect the laser beam. By using the electric or magnetic field to control a trajectory of the charged fuel droplets, the EUV system is able to avoid focus issues between the laser beam and the charged fuel droplets.

17 Claims, 4 Drawing Sheets

(56) References Cited

U.S. PATENT DOCUMENTS

| | | | | |
|---|---|---|---|---|
| 2010/0025223 | A1* | 2/2010 | Yanagida | H05G 2/003 204/157.15 |
| 2010/0078579 | A1* | 4/2010 | Endo | H05G 2/001 250/504 R |
| 2012/0080584 | A1* | 4/2012 | Partlo | G03F 7/70033 250/214.1 |
| 2012/0104289 | A1* | 5/2012 | Mizoguchi | H05G 2/008 250/504 R |
| 2012/0119116 | A1* | 5/2012 | Kakizaki | G03F 7/70033 250/504 R |
| 2012/0243566 | A1* | 9/2012 | Hori | H01S 3/10061 372/27 |
| 2013/0077073 | A1 | 3/2013 | Van Schoot et al. | |
| 2014/0111781 | A1* | 4/2014 | Chang | G03F 7/70916 355/30 |
| 2014/0264087 | A1 | 9/2014 | Rafac et al. | |

OTHER PUBLICATIONS

"Electric and Magnetic Field Lenses." pp. 108-136. Apr. 15, 1999.
Cymer. "World's First Integrated LPP EUV Source." May 8, 2015.
Cymer. "Keeping Moore's Law Alive." May 8, 2015.
Wells, et al. "Design and Fabrication of a VHF-CW High Repetion Rate Electron Gun." Proceedings of IPAC2014, Dresden Germany. ISBN 978-3-9540-132-8. Jul. 7, 2014.
Hecht, Jeff. "Photonic Frontiers: EUV Lithography: EUV Lithography Has Yet to Find Its Way Into the Fab." Laser Focus World. May 1, 2013.
Kimball Physics Inc. "High Energy Electron Beams, Two Lens System, High Currents up to 20 mA Pulsed." Sep. 4, 2012.
"Laser Produced Plasma EUV Source." Retrieved from www.cymer.com/files/images/Moores_Law.png. May 8, 2015.
Beringer, et al. "Passage of Particles Through Matter." (PDG), PR D86, 010001 (2012). Jun. 18, 2012.
Tatsuya, et al. "Study of Tin-Droplet Target EUV Source." MEXT Japan. Oct. 29, 2007.

\* cited by examiner

METHOD FOR EUV POWER IMPROVEMENT WITH FUEL DROPLET TRAJECTORY STABILIZATION

BACKGROUND

Photolithography is a process by which a reticle having a pattern is irradiated with light to transfer the pattern onto a photosensitive material overlying a semiconductor substrate. Over the history of the semiconductor industry, smaller integrated chip minimum features sizes have been achieved by reducing the exposure wavelength of optical lithography radiation sources to improve photolithography resolution. Extreme ultraviolet (EUV) lithography, which uses extreme ultraviolet (EUV) light having an exposure wavelength of between 10 nm and 130 nm, is a promising next-generation lithography solution for emerging technology nodes (e.g., 32 nm, 22 nm, 14 nm, etc.).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Typically, extreme ultraviolet (EUV) photolithography systems use extreme ultraviolet radiation having a 13.5 nm wavelength. One method of producing 13.5 nm wavelength radiation that has recently emerged is to shot a carbon dioxide ($CO_2$) laser at droplets of tin (Sn). The tin droplets are typically dropped into an EUV source vessel. As the droplets fall into the EUV source vessel, the $CO_2$ laser hits the tin droplets and heats the tin droplets to a critical temperature that causes atoms of tin to shed their electrons and become a plasma of ionized tin droplets. The ionized tin droplets emit photons having a wavelength of approximately 13.5 nm, which is provided as EUV radiation to a downstream optical lithography system.

It has been appreciated that the power of the EUV radiation generated by such a method depends upon how well a laser beam can be focused onto the tin droplets. For example, if the laser beam is properly focused, a desirable EUV power is achieved. However, forces within the EUV source vessel may cause the tin droplets to deviate from an expected trajectory causing the $CO_2$ laser to be out of focus with some of the tin droplets. For example, thermal waves from the $CO_2$ laser and/or a buoyancy of a medium within the EUV source vessel can result in changes in the position of the tin droplets falling into EUV source vessel. If the $CO_2$ laser is out of focus (i.e., focused to a position that is not hitting the tin droplet), a power of the resulting EUV radiation will be reduced. Since EUV radiation is typically formed from multiple tin droplets, which may have different trajectories within the EUV source, focus issues can lead to inconsistency in EUV power that can cause non-uniformities in exposure over the surface of a workpiece. For example, dose errors may range from less than 1% to greater than 10% over a single wafer.

Accordingly, the present disclosure relates to an EUV radiation source configured to generate charged tin droplets having a trajectory controlled by an electromagnetic field, and an associated method. In some embodiments, the EUV radiation source comprises a laser configured to generate a laser beam. A charged fuel droplet generator is configured to provide a plurality of charged fuel droplets to an EUV source vessel. The plurality of charged fuel droplets have a net positive or negative electrical charge. An electromagnetic field generator is configured to generate an electric field or a magnetic field. Therefore, trajectory remote control of the charged fuel droplets is enabled with the force exerted by the electric or magnetic field on the charged fuel droplets. Accordingly, by using the electric or magnetic field to control a trajectory of the charged fuel droplets, the EUV system is able to stabilize the trajectory and to avoid focus issues between the laser beam and the charged fuel droplets (e.g., to provide maximized and consistent EUV power that avoids non-uniformities in exposure over the surface of a substrate).

Figure 1:
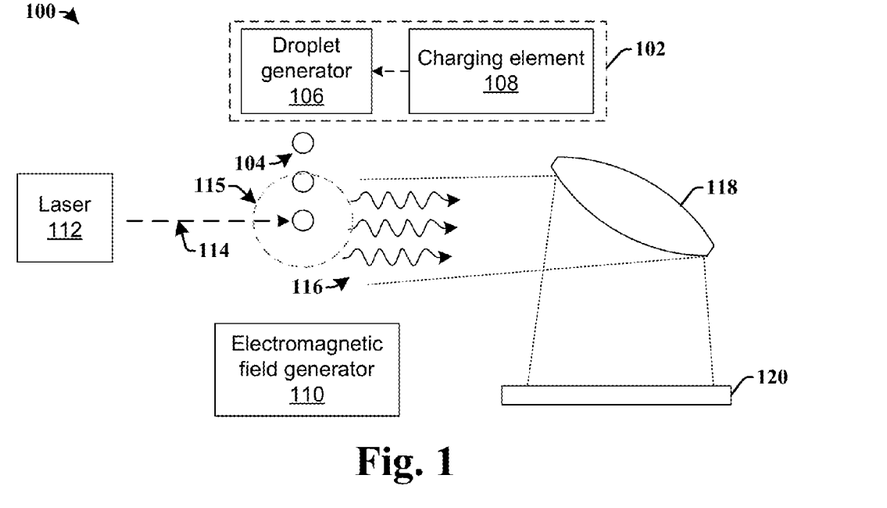
FIG. 1 illustrates a block diagram of some embodiments of an extreme ultraviolet (EUV) radiation source for an EUV photolithography system.

FIG. 1 illustrates a block diagram of some embodiments of an extreme ultraviolet (EUV) radiation source 100 for an EUV photolithography system.

The EUV radiation source 100 comprises a charged fuel droplet generator 102 configured to generate charged fuel droplets 104 having a net positive or negative electrical charge. In some embodiments, the charged fuel droplet generator 102 comprises a droplet generator 106 and a charging element 108. The droplet generator 106 is configured to generate un-charged fuel droplets. The charging element 108 is configured to impart a charge onto the un-charged fuel droplets to generate the charged fuel droplets 104 comprising a target material that has been ionized to have a positive or negative net charge. In some embodiments, the charged fuel droplets 104 may comprise tin (Sn). In other embodiments, the charged fuel droplets 104 may comprise a different metal material.

A laser 112 is configured to generate a laser beam 114 that is incident upon the charged fuel droplets 104. In some embodiments, the laser 112 may comprise a carbon dioxide ($CO_2$) laser. In other embodiments, the laser 112 may comprise alternative types of lasers. The laser beam 114 is configured to have a critical energy that is sufficient to ignite a plasma from the charged fuel droplets 104.

The EUV radiation source 100 further comprises an electromagnetic field generator 110 configured to generate an electric field and/or a magnetic field. The electric field and/or the magnetic field is configured to interact with the charged fuel droplets 104 generated by the charged droplet generator 102. For example, because of the net positive or negative charge of the charged fuel droplets 104, the electric and/or magnetic field will generate a force on the charged fuel droplets 104 (i.e., according to Coloumb's law). Therefore, the profile and strength of the electric and/or magnetic field may be selected to control a trajectory of the charged fuel droplets 104 (e.g., to control the trajectory of the charged fuel droplets to account for forces from thermal waves induced by plasma generation).

During operation of the EUV radiation source 100, the charged fuel droplets 104 fall from the charged fuel droplet generator 102. The charged fuel droplets 104 fall along a trajectory that is influenced by the electric field and/or a magnetic field generated by the electromagnetic field generator 110 to intersect a focal point of the laser beam 114. When the laser beam 114 hits the charged fuel droplets 104, the laser beam 114 heats the charged fuel droplets 104 to a critical temperature. At the critical temperature, the charged fuel droplets 104 shed their electrons and become a plasma 115 comprising ions. The ions of the plasma emit photons 116 having a wavelength of approximately 13.5 nm. The photons 116 are provided to a downstream optical system 118 that directs the photons 116 onto a workpiece 120.

Thus, by using the electric field and/or a magnetic field generated by the electromagnetic field generator 110 to stabilize and/or control the trajectory of the charged fuel droplets 104, EUV radiation source 100 avoids focus issues between the laser beam 114 and the charged fuel droplets 104. By avoiding focus issues, the power output from the EUV radiation source 100 can be maximized and non-uniformities in exposure over the surface of a workpiece 120 due to inconsistencies in EUV power can be mitigated.

Figure 2:
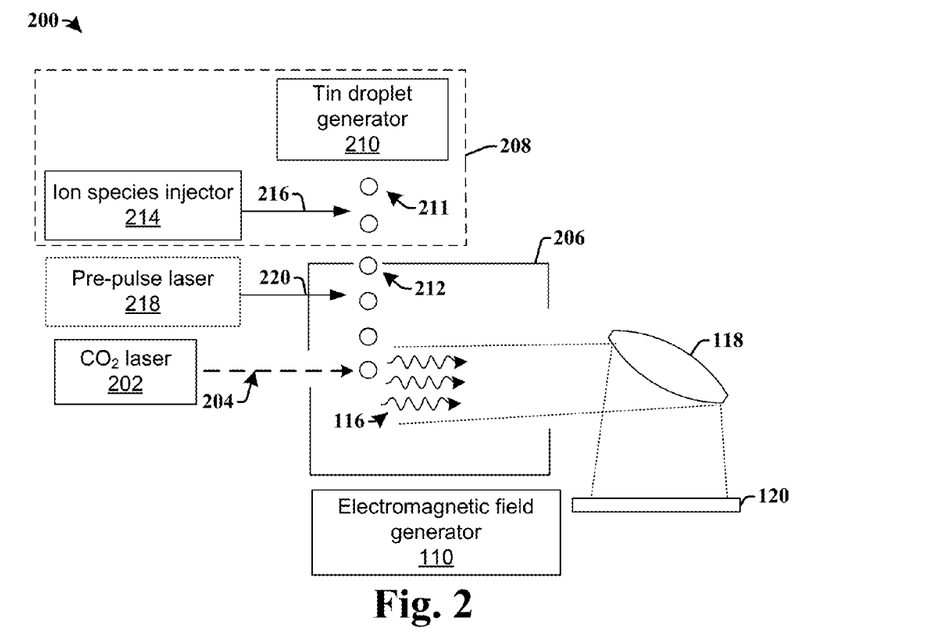
FIG. 2 illustrates a block diagram of some additional embodiments of an extreme ultraviolet (EUV) radiation source for an EUV photolithography system.

FIG. 2 illustrates a block diagram of some additional embodiments of an extreme ultraviolet (EUV) radiation source 200 for an EUV photolithography system.

The EUV radiation source 200 comprises a $CO_2$ laser 202 configured to generate a pulsed laser beam 204 comprising a plurality of pulses of infrared light. In some embodiments, the pulsed laser beam 204 may have principal wavelength bands centered around a range of between approximately 9 um and approximately 11 um. The pulsed laser beam 204 is provided within a housing of an EUV source vessel 206. In some embodiments, the EUV source vessel 206 may be held under vacuum.

A charged tin droplet generator 208 is configured to generate charged tin droplets 212, which are provided to the EUV source vessel 206. In some embodiments, the charged tin droplet generator 208 may comprise a tin droplet generator 210 and an ion species injector 214. The tin droplet generator 210 is configured to generate un-charged tin droplets 211. The ion species injector 214 is configured to generate a beam of charged ion species 216. Ions from the beam of charged ion species 216 adhere to the un-charged tin droplets 211 to form the charged tin droplets 212 that are introduced into the EUV source vessel 206. In some embodiments, the ion species injector 214 may comprise an electron beam configured to propel a beam of electrons at the un-charged tin droplets 211. In such embodiments, the resulting charged tin droplets 212 have a net negative charge.

The beam of charged ion species 216 output from the ion species injector 214 has an energy that is less than the critical energy of the un-charged tin droplets 211 (i.e., the energy needed to ignite a plasma from the un-charged tin droplets 211). For example, the beam of charged ion species 216 may have an energy of less than 11.9 MeV. In some embodiments, the beam of charged ion species 216 may have an energy that is between approximately 10 kilo-electron volts (KeV) and 200 approximately KeV, so as to form ions without producing significant amounts of photons. In some embodiments, the un-charged tin droplets 211 may have a size of between approximately 10 microns and approximately 30 microns. In some embodiments, the un-charged tin droplets 211 may be selected to have a size that gives a charge-to-mass ratio that provides for improved controllability of a charged tin droplet by electric and/or magnetic fields generated by electromagnetic field generator 110. For example, in some embodiments, the tin droplet generator 210 is configured to provide un-charged tin droplets 211 having a diameter of less than or equal to approximately 20 microns.

In some embodiments, the EUV radiation source 200 may further comprise a pre-pulse laser 218. The pre-pulse laser 218 is configured to generate a pre-pulse laser beam 220 that may be incident on the charged tin droplets 212 or the un-charged tin droplets 211. The pre-pulse laser beam 220 has an energy that is less than the $CO_2$ laser 202. The energy is insufficient to ignite a plasma from the tin droplets (e.g., is less than 11.9 MeV), but does deform the tin droplets (e.g., increase a target size/diameter of the tin droplets). In some embodiments, the pre-pulse laser 218 may comprise a carbon-dioxide ($CO_2$) laser that has a lower energy than the $CO_2$ laser 202.

In some embodiments, the ion species injector 214 may be separate from the pre-pulse laser 218. In other embodiments, the ion species injector 214 and the pre-pulse laser 218 may comprise a same element, such that the beam of charged ion species 216 (e.g., beam of electrons) can be combined with the pre-pulse laser beam 220. In such embodiments, the beam of charged ion species 216 is configured to both charge the un-charged tin droplets 211 and to deform a shape of the tin droplets. By having the beam of charged ion species 216 act to both charge the un-charged tin droplets 211 and to deform a shape of the tin droplets, the ion species injector 214 replaces the pre-pulse laser 218 (i.e., resulting in an EUV radiation source 200 that can cause ionization and deformation of tin droplets without a pre-pulse laser).

Figure 3:
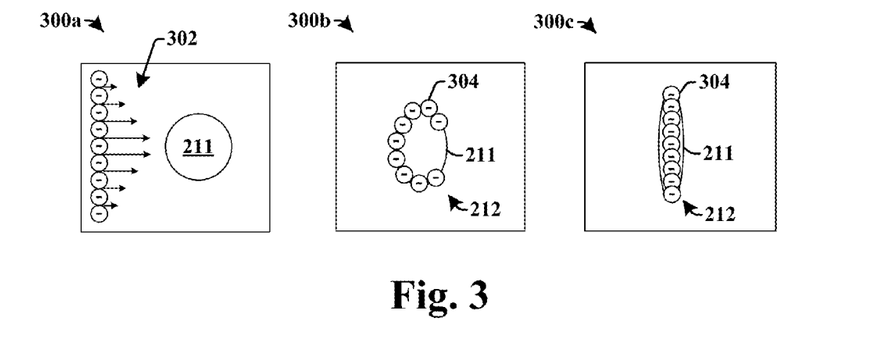
FIG. 3 illustrates some embodiments of cross-sectional views showing a tin droplet being hit with a beam of ion species configured to both charge the un-charged tin droplets and to deform the tin droplet.

FIG. 3 illustrates some embodiments of cross-sectional views showing a tin droplet being hit with a beam of charged ion species configured to both charge the un-charged tin droplet and to deform the tin droplet.

As shown in cross-sectional view 300a, an incident beam of charged ion species 302 hits an un-charged tin droplet 211. As illustrated, the beam of charged ion species 302 comprises electrons having a negative charge.

As shown in cross-sectional view 300b, ions 304 from the beam of charged ion species 302 attach to the un-charged tin droplet 211, causing the un-charged tin droplet 211 to become a charged tin droplet 212 having a net negative charge.

As shown in cross-sectional view 300c, the energy of the beam of charged ion species 302 also causes the charged tin droplet 212 to become deformed. In some embodiments, deformation of the tin droplet may cause a height of the charged tin droplet 212 to increase and a width of the charged tin droplet 212 to decrease. In such embodiments, the deformation of the tin droplets increases a target size that a subsequent laser beam hits to ignite a plasma from the tin droplets.

Figure 4:
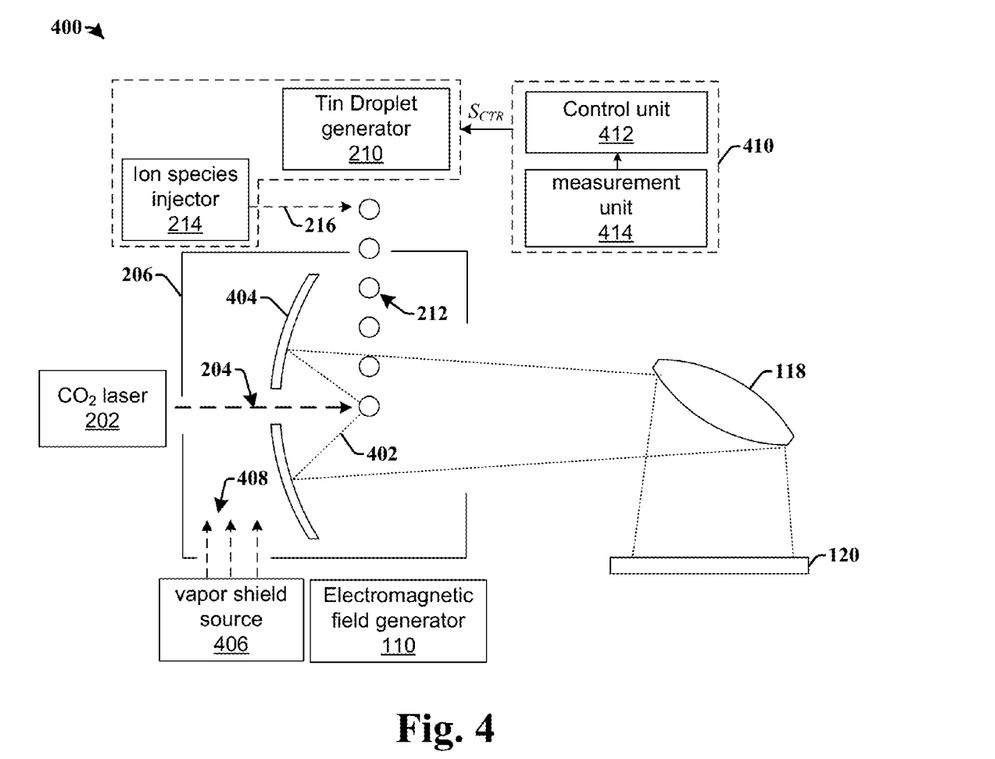
FIG. 4 illustrates a block diagram of some embodiments of an extreme ultraviolet (EUV) radiation source for an EUV photolithography system.

FIG. 4 illustrates a block diagram of some additional embodiments of an extreme ultraviolet (EUV) radiation source 400 for an EUV photolithography system.

The EUV radiation source 400 comprises a $CO_2$ laser 202 configured to generate a pulsed laser beam 204. Pulses from the $CO_2$ laser 202 illuminate charged tin droplets 212, causing the charged tin droplets 212 to radiate extreme ultraviolet (EUV) radiation 402 having a wavelength of approximately 13.5 nm.

A collector mirror 404 is positioned around the intersection of the charged tin droplets 212 and the pulsed laser beam 204. The collector mirror 404 has a surface with a concave curvature that is configured to focus the extreme ultraviolet radiation 402 emitted from the charged tin droplets 212 into a downstream optical system 118 that directs the extreme ultraviolet radiation 402 onto a workpiece 120.

In some embodiments, a vapor shield source 406 is configured to provide a gas 408 into the EUV source vessel 206. The gas 408 is configured to prevent residue from the charged tin droplets 212, which have not completely vaporized during plasma generation, from accumulating on the collector mirror 404. In some embodiments, the gas 408 may comprise hydrogen gas ($H_2$) or nitrogen gas ($N_2$), for example. It will be appreciated that the gas 408 may add additional turbulence within the EUV source vessel 206, which can disrupt the trajectory of the charged tin droplets 212. The electric and/or magnetic field generated by the electromagnetic field generator 110 reduces the effect of the turbulence on the plurality of charged tin droplets 212, thereby increasing the efficiency of the EUV radiation source 400 and decreasing contamination of the collector mirror 404.

In some embodiments, the EUV radiation source 400 may further comprise a control element 410 configured to adjust one or more characteristics of the beam of charged ion species 216 and/or the electromagnetic field generator 110. For example, in some embodiments, the control element 410 may be configured to generate a control signal $S_{CTR}$ that is provided to the ion species injector 214 to adjust a voltage, a current, a frequency, a beam shape, and/or a size of the beam of charged ion species 216. In some embodiments, the control element 410 may be configured to adjust the one or more characteristics of the beam of charged ion species 216 and/or the electromagnetic field generator 110 based upon one or more operating conditions of the EUV radiation source 400. In various embodiments, the one or more operating conditions may comprise a size of the tin droplets, a pressure of an EUV source vessel, a flow of gas 408 from the vapor shield source 406, etc.

In other embodiments, the control element 410 may comprise a control unit 412 and a measurement element 414. In some embodiments, the measurement element 414 may be configured to measure a position of the charged tin droplets 212. For example, the measurement element 414 may measure a position of the charged tin droplets 212 by an optical measurement tool (not shown). In other embodiments, the measurement element 414 may be configured to measure a power of the extreme ultraviolet radiation 402. Based upon a measured position of the charged tin droplets 212 and/or a power of the extreme ultraviolet radiation 402, the control unit 412 may generate a control signal $S_{CTR}$ that varies one or more characteristics of the charged tin droplet generator 210 and/or the electromagnetic field generator 110.

Figure 5:
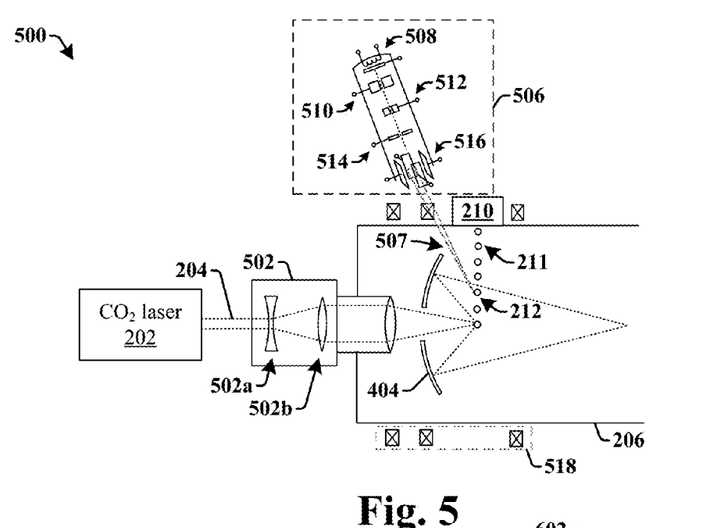
FIG. 5 illustrates a block diagram of some additional embodiments of an EUV radiation source.

FIG. 5 illustrates a block diagram of some additional embodiments of an EUV radiation source 500.

The EUV radiation source 500 comprises a $CO_2$ laser 202 configured to generate a laser beam 204 to a beam transport and focusing system 502. The beam transport and focusing system 502 comprises one or more lenses 502a, 502b arranged within a beam line and configured to focus the pulsed laser beam 204. The pulsed laser beam 204 is output from the beam transport and focusing system 502 to the EUV source vessel 206.

An ion species injector 506 is configured to generate a beam of charged ion species 507. In some embodiments, the ion species injector 506 may comprise one or more electron guns, respectively configured to generate a beam of electrons. In some embodiments, the electron gun may operate to generate electrons at a frequency of approximately 50,000 electrons or more per second. In other embodiments, the electron gun may operate to generate electrons at a frequency of less than 50,000 electrons per second. The electron gun may comprise an electron source 508 configured to generate a plurality of electrons. In some embodiments, the electron source 508 may comprise a hot cathode configured to generate electrons via thermionic emission. A collimator lens 510 is configured to form a beam of electrons. An aperture lens and condenser lens 512 are configured to focus the beam of electrons, and a downstream blanker 514 is configured to remove electrons that are outside of the beam. A beam deflector 516 receives the beam from the blanker 514 and directs the beam to a position intersecting un-charged tin droplets 211 output from a tin droplet generator 210. Electrons from the electron beam attach to the un-charged tin droplets 211 to generate charged tin droplets 212.

The EUV radiation source 500 further comprises an electromagnetic field generator 518. In some embodiments, the electromagnetic field generator 518 may comprise a conductive coil wrapped around an outer surface of the EUV source vessel 206. In various embodiments, the conductive coil may comprise a single coil, a double coil, a quadrupole coil, etc. The conductive coil is coupled to a current source (not shown) configured to provide a current to the conductive coil. As current passes through the conductive coil a magnetic field is generated within the EUV source vessel 206. In some embodiments, the electromagnetic field generator 518 may be configured to generate a magnetic field having a magnetic field strength in a range of between approximately 1 mT and approximately 5 T.

Figure 6:
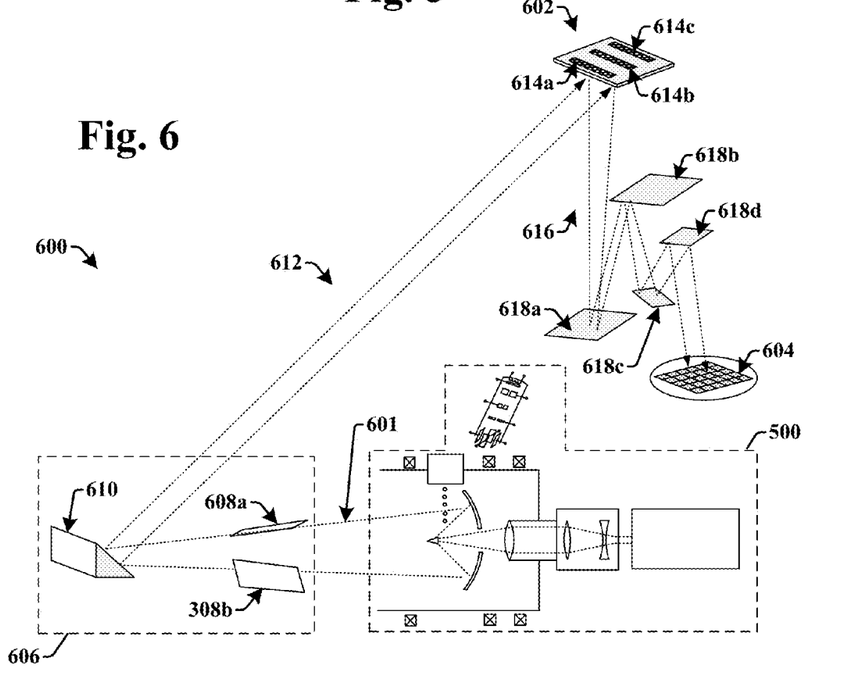
FIG. 6 illustrates a block diagram of some embodiments of an EUV photolithography system.

FIG. 6 illustrates an EUV photolithography system 600 having a disclosed EUV radiation source. Although the EUV photolithography system 600 is illustrated as having a certain configuration of components, it will be appreciated that the disclosed EUV radiation source may be implemented in EUV photolithography systems having additional components (e.g., additional mirrors) or having less components (e.g., less mirrors).

The EUV photolithography system 600 comprises EUV radiation source 500 configured to supply EUV radiation 601 (i.e., with wavelengths in a range of between about 10 nm and about 130 nm) to a reticle 602. The EUV radiation source 500 is configured to generate the EUV radiation by hitting charged fuel droplets with a laser to generate a plasma of ions that emit photons at a wavelength of between approximately 10 nm and approximately 130 nm.

The EUV radiation 601 output from the EUV radiation source 500 is provided to a condenser 606. In some embodiments, the condenser 606 comprises first and second surfaces, 608a and 608b, configured to focus the EUV radiation 601, and a reflector 610 configured to reflect the EUV radiation 612 towards the reticle 602. The reticle 602 is configured to reflect the EUV radiation 612 to form a pattern on a surface of a semiconductor workpiece 604. To produce the pattern, the reticle 602 comprises a plurality of absorptive features 614A-614C arranged on a front surface of the reticle 602. The plurality of absorptive features 614A-614C are configured to absorb the EUV radiation 612, such that the reflected rays of radiation 616 conveys a patterned defined by the reticle 602.

The EUV radiation 616 is filtered through reduction optics comprising a series of first through fourth mirrors 618a-618d, which serve as lenses to reduce a size of the pattern carried by the EUV radiation 616. The fourth mirror 618d conveys the EUV radiation 616 onto a on a layer of photoresist disposed on a surface of the semiconductor workpiece 604. The EUV radiation patterns the layer of photoresist so that subsequent processing can be performed on selected regions of the semiconductor workpiece 604.

Figure 7:
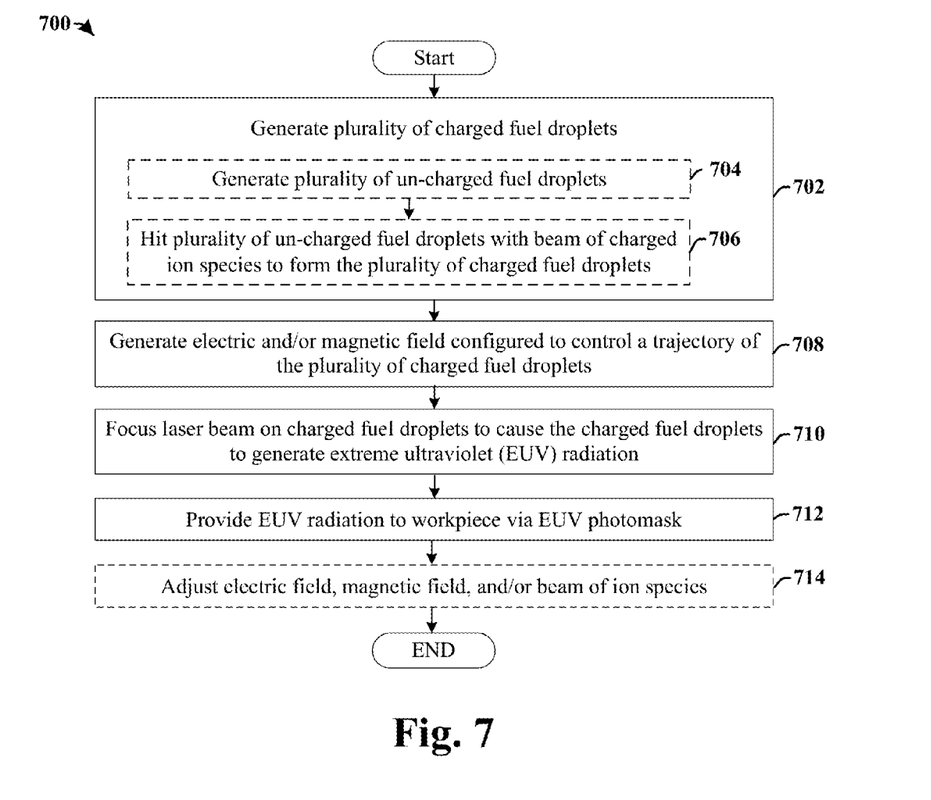
FIG. 7 illustrates a flow diagram of some embodiments of a method of performing an EUV photolithography process.

FIG. 7 illustrates a flow diagram of some embodiments of a method 700 of performing an EUV photolithography process.

While the disclosed method 700 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 702, a plurality of charged fuel droplets are generated. The plurality of charged fuel droplets may have a net electrical charge that is positive or negative. In some embodiments, the plurality of electrically charged fuel droplets may comprise tin droplets.

In some embodiments, the plurality of charged fuel droplets may be generated according to acts 704-706. At 704, a plurality of un-charged fuel droplets are generated. At 706, the plurality of un-doped fuel droplets are hit with a beam of charged ion species. Ions from the beam of charged ion species will attach to the un-charged fuel droplets to form the plurality of charged fuel droplets.

At 708, an electric field and/or a magnetic field configured to control a trajectory of the electrically charge fuel droplets is generated. The electric field and/or the magnetic field are generated at a position that interacts with the charged fuel droplets.

At 710, a laser beam is focused on the charged fuel droplets to generate extreme ultraviolet (EUV) radiation. In some embodiments, the laser beam may comprise a laser beam generated by a carbon dioxide ($CO_2$) laser. The laser beam may excite atoms within the charged fuel droplets to ignite a plasma having ions that output photons having a wavelength in the extreme ultraviolet spectrum.

At 712, the EUV radiation is provided to a workpiece via an EUV photomask.

At 714, the electric field, the magnetic field, and/or the beam of ion species may be adjusted. The electric field, the magnetic field, and/or the beam of ion species may be adjusted based upon a measured position of the charged droplets of tin, a power of the EUV radiation, and/or one or more parameters of the EUV system (e.g., a size of the tin droplets, a pressure of an EUV source vessel, etc.).

Therefore, the present disclosure relates to an extreme ultraviolet (EUV) radiation source that generates charged tin droplets having a trajectory controlled by an electric field and/or a magnetic field, and an associated method In some embodiments, the present disclosure relates to an extreme ultraviolet (EUV) radiation source. The EUV radiation source comprises a charged fuel droplet generator configured to provide a plurality of charged fuel droplets having a net positive or negative electrical charge to an EUV source vessel. The EUV radiation source further comprises a laser configured to generate a laser beam having a sufficient energy to ignite a plasma from the charged fuel droplets, which emits extreme ultraviolet radiation. The EUV radiation source further comprises an electromagnetic field generator configured to generate an electric field or a magnetic field that controls a trajectory of the charged fuel droplets within the EUV source vessel.

In other embodiments, the present disclosure relates to an EUV radiation source. The EUV radiation source comprises a tin droplet generator configured to generate a plurality of un-charged tin droplets. The EUV radiation source further comprises an electron gun configured to generate a beam of electrons that is incident upon the plurality of un-charged tin droplets, wherein upon hitting the plurality of un-charged tin droplets the electrons attach to the plurality of un-charged tin droplets to generate the plurality of charged tin droplets having a net negative electrical charge. The EUV radiation source further comprises a carbon dioxide ($CO_2$) laser configured to generate a laser beam having a sufficient energy to ignite a plasma from the plurality of charged tin droplets within an EUV source vessel, wherein the plasma emits extreme ultraviolet radiation. The EUV radiation source further comprises an electromagnetic field generator configured to generate an electric field or a magnetic field that controls a trajectory of the plurality of charged tin droplets.

In yet other embodiments, the present disclosure relates to a method of generating extreme ultraviolet (EUV) radiation. The method comprises generating a plurality of charged fuel droplets having a net positive or negative electrical charge. The method further comprises generating an electric field or a magnetic field configured to control a trajectory of the plurality of charged fuel droplets. The method further comprises focusing a laser beam on the plurality of charged fuel droplets to generate extreme ultraviolet (EUV) radiation.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An extreme ultraviolet (EUV) radiation source, comprising:
    a charged fuel droplet generator configured to provide a plurality of charged fuel droplets having a net positive or negative electrical charge to an EUV source vessel wherein the charged fuel droplet generator comprises a fuel droplet generator configured to provide a plurality of uncharged fuel droplets to an EUV source vessel and an ion species injector configured to generate a beam of charged ion species that is incident upon the plurality of uncharged fuel droplets, wherein upon hitting the plurality of uncharged fuel droplets, the charged ion species attach to the plurality of uncharged fuel droplets to generate the plurality of charged fuel droplets;
    a laser configured to generate a laser beam having a sufficient energy to ignite a plasma from the charged fuel droplets, wherein the plasma emits extreme ultraviolet radiation; and
    an electromagnetic field generator configured to generate an electric field or a magnetic field that stabilizes a trajectory of the charged fuel droplets within the EUV source vessel, prior to ignition of the charged fuel droplets, along a path intersecting the laser beam; a control element configured to selectively adjust one or more characteristics of the ion species injector; and a measurement unit configured to measure a position of the charged fuel droplets and to provide a control signal to the control element to adjust a shape or size of the beam of charged ion species.

2. The EUV radiation source of claim 1, wherein the ion species injector comprises an electron gun configured to generate an electron beam, wherein the electron gun comprises:
    a hot cathode configured to generate electrons via thermionic emission;
    a collimator lens configured to form a beam of electrons;
    an aperture lens and a condenser lens configured to focus the beam of electrons; and
    a downstream blanker configured to remove electrons that are outside of the beam of electrons to form the electron beam.

3. The EUV radiation source of claim 1, wherein the beam of charged ion species has a lower energy than the laser beam, and the beam of charged ion species is configured to deform the plurality of charged fuel droplets to increase a size of the charged fuel droplets as viewed from the laser.

4. The EUV radiation source of claim 1, further comprising:
    a pre-pulse laser configured to generate a pre-pulse laser beam, having a lower energy than the laser beam, which is configured to deform the plurality of charged fuel droplets, wherein the pre-pulse laser is arranged so that the pre-pulse laser beam hits the plurality of charged fuel droplets prior to the laser beam hitting the plurality of charged fuel droplets.

5. The EUV radiation source of claim 1, further comprising:
    a vapor shield source configured to provide a gas into the EUV source vessel that mitigates accumulation of residue from the charged fuel droplets, which have not been completely vaporized when struck by the laser beam, on a collector mirror.

6. The EUV radiation source of claim 1, wherein the electromagnetic field generator comprises a conductive coil wrapped around the EUV source vessel and configured to control the trajectory of the plurality of charged fuel droplets by way of the electric field or the magnetic field.

7. The EUV radiation source of claim 1, wherein the plurality of charged fuel droplets comprise tin.

8. The EUV radiation source of claim 1, wherein the un-charged fuel droplets have a diameter of less than or equal to approximately 20 microns so as to provide for a charge-to-mass ratio that improves controllability of the charged fuel droplets by the electric field or the magnetic field.

9. An EUV radiation source, comprising:
    a tin droplet generator configured to generate a plurality of un-charged tin droplets;
    an electron gun configured to generate an electron beam that is incident upon the plurality of un-charged tin droplets, wherein upon hitting the plurality of un-charged tin droplets electrons from the electron beam attach to the plurality of un-charged tin droplets to generate a plurality of charged tin droplets having a net negative electrical charge, wherein the electron gun comprises:
        a hot cathode configured to generate electrons via thermionic emission;
        a collimator lens configured to form a beam of electrons;
        an aperture lens and a condenser lens configured to focus the beam of electrons; and
        a downstream blanker configured to remove electrons that are outside of the beam of electrons to form the electron beam;
    a carbon dioxide ($CO_2$) laser configured to generate a laser beam having a sufficient energy to ignite a plasma from the plurality of charged tin droplets within an EUV source vessel, wherein the plasma emits extreme ultraviolet radiation; and
    an electromagnetic field generator configured to generate an electric field or a magnetic field that controls a trajectory of the plurality of charged tin droplets; a control element configured to selectively adjust one or more characteristics of the electron gun; and a measurement unit configured to measure a position of the charged tin droplets and to provide a control signal to the control element that causes the control element to adjust the one or more characteristics of the electron gun.

10. The EUV radiation source of claim 9, further comprising:
    a collector mirror having a concave curvature configured to focus the extreme ultraviolet radiation to a downstream optical system comprising a plurality of mirrors configured to convey the extreme ultraviolet radiation to a semiconductor workpiece; and
    a pre-pulse laser configured to generate a pre-pulse laser beam, having a lower energy than the laser beam, which is configured to deform the plurality of charged tin droplets, wherein the pre-pulse laser is arranged so that the pre-pulse laser beam hits the plurality of charged tin droplets prior to the laser beam hitting the plurality of charged tin droplets.

11. The EUV radiation source of claim 10, further comprising:
a vapor shield source configured to provide a gas into the EUV source vessel that mitigates accumulation of residue from the charged tin droplets, which have not been completely vaporized when struck by the laser beam, on the collector mirror.

12. The EUV radiation source of claim 9, wherein the electromagnetic field generator comprises a conductive coil wrapped around the EUV source vessel and configured to control the trajectory of the plurality of charged tin droplets.

13. The EUV radiation source of claim 9, wherein the electron beam has a lower energy than the laser beam, and the electron beam is configured to deform the plurality of charged tin droplets.

14. The EUV radiation source of claim 10, wherein the electron gun is arranged between the pre-pulse laser and the tin droplet generator.

15. A method of generating extreme ultraviolet (EUV) radiation, comprising:
generating a plurality of charged fuel droplets having a net positive or negative electrical charge by hitting a plurality of uncharged fuel droplets with a beam of charged ion species;
generating an electric field or a magnetic field configured to stabilize a trajectory of the plurality of charged fuel droplets;
focusing a laser beam on the plurality of charged fuel droplets to generate extreme ultraviolet (EUV) radiation measuring a position of the charged fuel droplets; and adjusting one or more characteristics of the beam of charged ion species based upon the measured position; and
wherein the electric field or the magnetic field stabilizes the trajectory of the plurality of charged fuel droplets, prior to ignition of the charged fuel droplets, along a path intersecting the laser beam.

16. The method of claim 15, wherein generating the plurality of charged fuel droplets comprises:
generating a plurality of un-charged fuel droplets; and
hitting the plurality of un-charged fuel droplets with a beam of ion species to form the plurality of charged fuel droplets.

17. The method of claim 15, further comprising:
operating a conductive coil wrapped around an EUV source vessel to generate the electric field or the magnetic field configured to control the trajectory of the plurality of charged fuel droplets prior to ignition of the charged fuel droplets.

* * * * *